(12) United States Patent
Suh et al.

(10) Patent No.: US 7,375,462 B2
(45) Date of Patent: May 20, 2008

(54) ORGANIC ELECTROLUMINESCENT DISPLAY DEVICE COMPRISING ULTRAVIOLET LIGHT STABILIZER

(75) Inventors: Min-Chul Suh, Seongnam-si (KR);
Nam-Choul Yang, Seoul (KR);
Mu-Hyun Kim, Suwon-si (KR);
Byung-Doo Chin, Seongnam-si (KR);
Seong-Taek Lee, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 25 days.

(21) Appl. No.: 10/900,273

(22) Filed: Jul. 28, 2004

(65) Prior Publication Data
US 2005/0023966 A1    Feb. 3, 2005

(30) Foreign Application Priority Data
Jul. 29, 2003    (KR) ................ 10-2003-0052454

(51) Int. Cl.
*H01J 1/62* (2006.01)
*H01J 63/04* (2006.01)

(52) U.S. Cl. .................. 313/504; 313/498; 313/503; 313/506

(58) Field of Classification Search ........... 313/498, 313/502–504, 506, 512; 428/690, 917
See application file for complete search history.

(56) References Cited

U.S. PATENT DOCUMENTS 6,268,965 B1    7/2001    Enomoto ............... 359/692
6,497,598 B2    12/2002    Affinito ................... 445/24
6,670,772 B1 *    12/2003    Arnold et al. .......... 315/169.3
6,699,597 B2 *    3/2004    Bellmann et al. ........... 428/690

FOREIGN PATENT DOCUMENTS

| CN | 1159131 | 9/1997 |
| JP | 04-298989 | 10/1992 |
| JP | 2000-273316 | 10/2000 |

* cited by examiner

Primary Examiner—Nimeshkumar D. Patel
Assistant Examiner—Kevin Quarterman
(74) Attorney, Agent, or Firm—H.C. Park & Associates, PLC

(57) ABSTRACT

The present invention relates to an organic electroluminescent display device comprising a UV stabilizer and provides an organic electroluminescent display device whose characteristics are not degraded by ultraviolet rays even after being exposed to sunlight by providing an organic electroluminescent display device comprising a substrate, a first electrode formed on the substrate, a light emitting layer formed on the first electrode, and a second electrode formed on the upper part of the light emitting layer, wherein the light emitting layer is doped with a UV stabilizer, and the UV stabilizer has an absorption range of 420 nm or less.

17 Claims, 2 Drawing Sheets

ORGANIC ELECTROLUMINESCENT DISPLAY DEVICE COMPRISING ULTRAVIOLET LIGHT STABILIZER

CROSS REFERENCE

This application claims the benefit of Korean Patent Application No. 2003-52454, filed on Jul. 29, 2003, the disclosure of which is hereby incorporated herein by reference in its entirety.

BACKGROUND OF THE INVENTION (a) Field of the Invention

The present invention relates to an organic electroluminescent display device, more particularly, to an organic electroluminescent display device comprising an ultraviolet (UV) light stabilizer as a constituent.

(b) Description of Related Art

A conventional organic electroluminescent display device consists of various layers such as anode and cathode electrodes, a hole injection layer, a hole transport layer, a light emitting layer, an electron transport layer and an electron injection layer. In the case of a small molecular organic electroluminescent display device, the respective layers can be introduced by vacuum deposition, and it is easy to mix at least one or more materials in one layer through use of the co-deposition method.

In the case where a polymer layer is used as a hole injection layer, a UV stabilizer can be dissolved along with the solution during preparation of the solution so that a soluble UV stabilizer is used and only the desired part of the polymer layer is formed by a wet process.

A structural approach for making a barrier in a polymer-ceramic-polymer shape to prevent deterioration of the characteristics as the environment affects the components of an organic electroluminescent display device is introduced in U.S. Pat. Nos. 6,497,598 and 6,268,695. However, these prior patents do not teach a detailed device structure using additives capable of directly reducing the environmental effects upon electroluminescent (EL) components.

SUMMARY OF THE INVENTION

Therefore, in order to solve the foregoing problems of the prior art, the present invention is to provide an organic electroluminescent display device whose lifetime is increased by adding a UV stabilizer to the fundamental organic film layers in the EL components, thereby extensively improving essential characteristics of the EL components that are sensitive to an external environmental effect to prevent photo-decomposition from changing these characteristics when an organic electroluminescent display device is used in sunlight.

The present invention provides an organic electroluminescent display device comprising a substrate, a first electrode formed on the substrate, a light emitting layer formed on the first electrode, and a second electrode formed on the upper part of the light emitting layer, wherein the light emitting layer is doped with a UV stabilizer, and the UV stabilizer has an absorption range of 420 nm or less.

Furthermore, the present invention provides an organic electroluminescent display device comprising a substrate, a first electrode formed on the substrate, a light emitting layer formed on the first electrode, a second electrode formed on the upper part of the light emitting layer, and an organic film layer having an electric charge carrying capability formed between the first electrode and second electrode, wherein the organic film layer having an electric charge carrying capability is doped with a UV stabilizer, and the UV stabilizer has an absorption range of 420 nm or less.

BRIEF DESCRIPTION OF THE DRAWINGS

The above and other features and advantages of the present invention will become more apparent to those of ordinary skill in the art by describing in detail preferred embodiments thereof with reference to the attached drawings.

DETAILED DESCRIPTION OF THE INVENTION

Figure 1:
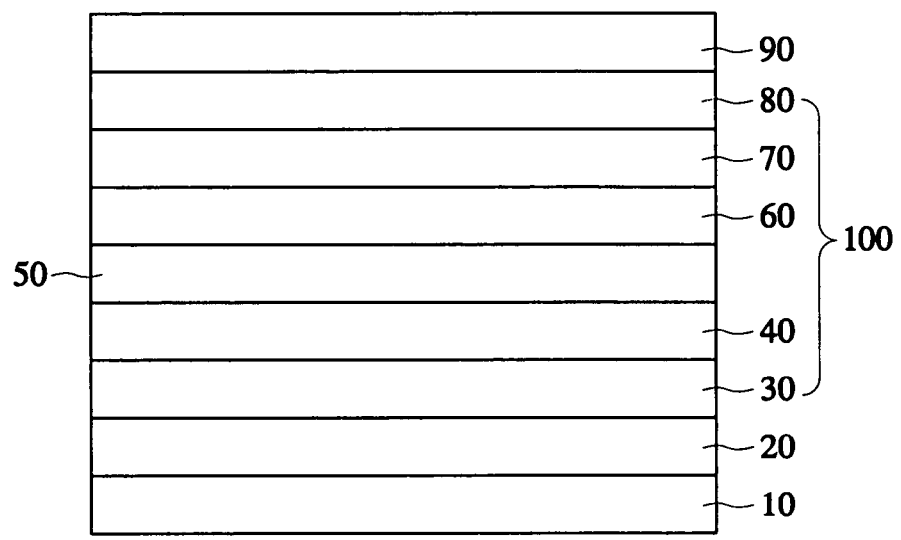
FIG. 1 is a drawing illustrating a cross section of an organic electroluminescent display device according to a preferred embodiment of the present invention.

The present invention will now be described in detail in connection with preferred embodiments with reference to the accompanying drawings. For reference, like reference characters designate corresponding parts throughout several views.

When an organic electroluminescent display device is exposed to an external environment, light and oxygen cause degradation in ordinary organic materials and reduces the mechanical and physical properties of the organic electroluminescent display device. Therefore, a material capable of preventing physical and chemical degradations caused by light from the external environment is required; such a material is called a light stabilizer.

Light leading to degradation is mostly sunlight in the wavelength range that is not absorbed by the atmosphere.

For example, ultraviolet rays in sunlight having short wavelengths of 175 nm or less are absorbed by oxygen in a layer 100 km above the sea level, whereas radiation having wavelengths from 300 to 400 nm is absorbed by ozone in the stratosphere formed in the upper air about 15 km above the sea level.

On the other hand, radiation with wavelengths from 300 to 400 run is not absorbed and remains in the ultraviolet ray part of sunlight and thereby can cause degradation of an organic material exposed to the open air.

Furthermore, some ultraviolet rays are scattered by aerosol particles such as water drops dust, and air molecules in the atmosphere in addition to being partially absorbed by the ozone.

As a result, radiation that reaches the earth's surface and causes degradation of organic materials consists of both direct ultraviolet rays and scattered ultraviolet rays.

Some mechanisms by ultraviolet rays that reach the earth's surface degrade organic materials are as follows:

1. Physicochemical Processes Occurring From Light Absorption

Incident light reflects from the surface of an organic film, or scatters from or is absorbed into the organic film. According to the first law of photochemistry (grottus-draper), a part of the effectively absorbed light causes a photochemical transformation resulting in degradation.

Under the existence of double bond (chromophores), the absorption is moved to a long wavelength side and is particularly effective to double bond between carbon and other atom, and carbonyl compound absorbs a light in the wavelength range of 290 nm or more.

Degradation is caused by a small quantity of impurities during the manufacturing process causing structural irregularity due to catalyst residues and oxides that frequently exist in an organic layer. The irregular structure displays absorption inside the ultraviolet ray range capable of causing photochemical transformation. Furthermore, light passage is substantially increased by scattering of light due to crystallization in a semicrystalline thin film compared to amorphous substance. Therefore, an energy amount that can be sensed even though double bond group (chromophoric group) exists at a very low concentration can be absorbed.

Activation spectrum of organic materials displays sensitivity of polymer for wavelength radiated by a special radiation source, wherein the activation spectrum is one degradation measuring standard, shows reactivity of materials and is constant according to types of sources since it is not corrected for other intensity in different wavelength.

(2) Photooxidation Scheme

If a polymer is exposed to light, a free radical is produced by the excitation of an absorption group inside the polymer.

(1) Chain in Itiation

Chain propagation occurs if ultraviolet rays are irradiated onto hydroperoxide POOH, carbonyl compound free radicals, or residues of a catalyst such as Ti.

(2) Chain Propagation

P.+O2→PO2.

PO2.+PH→PO2H+P.

The-above produced free radicals act by the following various mechanisms.

(3) Chain Branching

POOH→PO.+.OH

POOH+PH→PO.+P.+H2O

2POOH→PO2.+PO.+H2O

PO.+PH→POH+P.

.OH+PH→H2O+P.

(4) Chain Termination

.+P.→P−P

P.+PO2.→POOP

PO2.+PO2.→POOP+O2

PO2.+PO2.→substance that does not have radicals (nonradical products)+O2

Organic materials decompose according to the above mechanisms or are degraded by ultraviolet rays due to the generation of oxygen. To prevent this decomposition or degradation, the following types of UV stabilizers are added:

1) UV Stabilizer for Preventing Absorption of Ultraviolet Rays or Reducing the Amount of Light Absorbed by Double Bond (Chromophores)—UV Absorbent Stabilizer The protection mechanism of the UV absorbent stabilizer basically absorbs ultraviolet rays so that the absorbed ultraviolet rays together with heat are dispersed in such a way that photosensitization does not occur.

The compounds should have a very high absorbency themselves and be very stable. A basic defect of UV absorbent stabilizers is that they require a certain absorption depth (thickness of sample) to protect an organic film. Therefore, the UV absorbent stabilizers may not be used in thin products such as fiber and film.

Hydroxybenzophenone type UV absorbent stabilizers are basically derived from 2,4-dihydroxybenzophenone, and commercially typical products of the UV absorbent stabilizers include 2,2,4-trihydroxybenzophenone and 2,2,4,4-tetrahydroxybenzophenone.

Energy transition of hydroxybenzophenone is carried out in such a way that 2-hydroxybenzophenone exposed to light transmits thermal energy to the surrounding medium and is changed into an initial shape of enol form.

The energy transition is performed rapidly and caused by radiation free spectroscopic data.

The UV absorbent stabilizer types are described as follows:

a. A cinnamate type UV absorbent stabilizer absorbs the wavelength range of 290 to 320 nm, which is a much shorter wavelength band compared to the wavelength band absorbed by 2-(2-hydroxylphenyl)-benzotriazole or 2-hydroxybenzophenone, and converts energy into heat with high efficiency with plenty of vibrational possibilities.

Although the cinnamate type UV absorbent stabilizer can be quenched by a specific super-position between a cinnamic acid derivative or absorption band and an emission band of polypropylene or polystyrene, the cinnamate type UV absorbent stabilizer shows a low efficiency overall due to insufficient usability with polymers.

b. An oxanilide type UV absorbent stabilizer absorbs wavelengths from 280 to 320 nm, which is shorter than the wavelength band and absorbed by a cinnamate type UV absorbent stabilizer. This absorption by the oxanilide type UV absorbent stabilizer is caused by an internal filter effect and a proton transition effect in the absorption wavelength band.

The oxanilide type UV absorbent stabilizer quenches carbonyl groups because it lowers and consumes chain scission through a norrish type II reaction of a long chain ketone capable of being produced in an organic film. The oxanilide type UV absorbent stabilizer has a low absorption efficiency since low compatibility gives carbonyl groups to composite stabilizers in the ground state although it has a low compatibility with organic soluble materials.

c. Resorcinol monobenzoate absorbs a shorter wavelength than the oxanilide type UV absorbent stabilizer. Exposure to UV light rearranges the resorcinol monobenzoate into 2-hydroxybenzophenone. However, it can not act as a UV absorbent stabilizer in this molecular structure. Absorption efficiency of the resorcinol monobenzoate is low since the resorcinol monobenzoate is not rearranged by the amount thereof, and it produces a secondary product at the same time.

d. Salicylate absorbs longer wavelengths than oxalamide absorbs.

2) Quencher for Reducing Initiation Speed Through Deactivation of the Excited state of Double Bond Groups (Chromophore Groups)

A quencher is a light stabilizer capable of taking over energy absorbed by double bond (chromophores) Ks existing in plastic and quenching that energy into heat or fluorescent or phosphorescent radiation, thereby effectively preventing degradation.

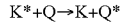

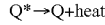

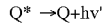

An example of a quencher is a hydroperoxide decomposer for transposition of hydroperoxides into more stable compounds without production of free radicals before the hydroperoxides are split by photo-decomposition.

Metal complexes of sulfur-contained compounds are very effective UV stabilizers that reduce the amount of hydroperoxide inside an already oxidized organic film at an ordinary temperature. They are very effective as a hydroperoxide decomposer even though a very small quantity of the metal complexes is used.

3) Free Radical Scavenger for Removing Free Radicals as Soon as Possible After Alkyl or Peroxide Radicals are Produced A scavenger is capable of suppressing radical reactions by removing activity of intermediate free radicals generated when organic materials are exposed to ultraviolet rays.

Additionally, hindered amine light stabilizers (HALS), among other light stabilizers, have been developed recently and are currently being used more than any other stabilizer.

4) Radiation Screener for Screening Radiation

Damage from UV light can be suppressed by depositing on the surface of the organic materials a material that cuts off infiltration of UV rays into the organic materials.

On the other hand, the radiation screener is selected by considering physical condition (liquid/solid), melting point, particle size, particle distribution, thermal stability, interaction with other additives, toxicity (food packing), volatility and compatibility with the polymer in order to apply an UV stabilizer like the radiation screener to special purposes as an additive.

In the present invention, it is preferable to dope UV stabilizer on organic materials included in an organic electroluminescent display device of the present invention to prevent decomposition and degradation of the organic materials by ultraviolet rays.

FIG. 1 is a drawing illustrating cross section of an organic electroluminescent display device according to preferred embodiment of the present invention.

Referring to FIG. 1, an organic electroluminescent display device of the present invention comprises a substrate 10, a first electrode 20 formed on the substrate 10, a light emitting layer 50 formed on the first electrode 20, and a second electrode 90 formed on the upper part of the light emitting layer 50.

An UV stabilizer is doped on the light emitting layer 50 to prevent decomposition of an organic light emitting layer due to ultraviolet rays. The UV stabilizer should absorb ultraviolet rays by absorbing light having a wavelength of 420 nm or less as described above.

One or more compounds selected from the group consisting of hydroxybenzophenone-based compound, hydroxyphenylbenzotriazole-based compound, hindered-amines-based compound, organometallic compound comprising one metal selected from the group consisting of iron, nickel and cobalt, salicylate-based compound, cinnamate derivative, resorcinol-monobenzoates-based compound, oxanilides-based compound, hydroxybenzoates-based compound, organic or inorganic pigment, carbon black, coumarines-based compound, stilbene derivative, benzoxazolyl-based compound, benzimidazolyl-based compound, naphthlyimide-based compound, diaminostilbenesulfonate-based compound, triazinestilbene-based compound, phenylester-based compound, benzotriazole-based compound, S-triazine-based compound, hydroxyphenyl-derivative-of-benzoxazole-based compound, hexamethylphosphoricamide-based compound, benzylidenemalonate-based compound, aliphatic-amine-or amino-alcohol-based derivative, nitroaromatic compound, substituted-acrylonitrile-based compound, ferrocene-based compound, nitrophenylazophenol-based compound, azo compound, polyene-based polymer derivative, piperidine-based compound, piperidineoxy-based compound, borontrifluoride-based compound, thiadiazole-based compound, and Phosphonate-based compound are used as the UV stabilizer.

A light stabilizer is generally used in the concentration range of 0.001 to 10%, wherein an upper limit of the concentration range is used only in an exceptional case. Use of the light stabilizer in a concentration of less than 0.001% is not preferable because the UV blocking effect is insufficient. Use of the light stabilizer in a concentration of more than 10% results in an undesirable device because current leaks or characteristics are deteriorated.

If the first electrode 20 is an anode electrode that is an ordinary metal electrode, the second electrode 90 becomes a transparent cathode electrode so that an organic electroluminescent display device has a front light emitting structure.

On the other hand, if the first electrode 20 is a transparent cathode electrode, the second electrode 90 becomes a reflective anode electrode so that an organic electroluminescent display device has a rear light emitting structure. Or the second electrode may be transparent as well so that the organic electroluminescent display device has a double-side light emitting structure.

An organic electroluminescent display device of the present preferred embodiment further comprises an organic film layer 100 having electric charge carrying capability formed between the first electrode 20 and second electrode 90.

The organic film layer 100 having electric charge carrying capability comprises one or more layers selected from the group consisting of the hole injection layer 30, hole transport layer 40, hole blocking layer 60, electron transport layer 70, and electron injection layer 80, wherein generally, the hole injection layer 30 and hole transport layer 40 are formed between the first electrode 20 and light emitting layer 50, and the hole blocking layer 60, electron transport layer 70 and electron injection layer 80 are formed between the light emitting layer 50 and second electrode 90.

The hole injection layer 30, hole transport layer 40, hole blocking layer 60, electron transport layer 70 and electron injection layer 80 are preferably doped with a UV stabilizer as organic materials are ordinarily used in an organic electroluminescent display device.

In an organic electroluminescent display device according to one of the embodiments, the light emitting layer 50 is doped with a UV stabilizer, and the hold injection layer 30, hole transport layer 40, hole blocking layer 60, electron transport layer 70, and electron injecting layer 80, one or more of which compose an additionally added organic film layer 100 having electric charge carrying capability 100, are either not doped with the UV stabilizer, partially doped with the UV stabilizer, or fully doped with the UV stabilizer.

The same material as the UV stabilizer doped on the light emitting layer 50 may be used as the UV stabilizer doped on the respective hole injection layer 30, hole transport layer 40, hole blocking layer 60, electron transport layer 70 or electron injection layer 80. The UV stabilizer may be also doped on the respective hole injection layer 30, hole transport layer 40, hole blocking layer 60, electron transport layer 70 or electron injection layer 80 to a concentration of 0.001 to 10%.

Furthermore, another preferred embodiment of the present invention discloses an organic electroluminescent display device comprising a substrate 10, a first electrode 20 formed on the substrate 10, a light emitting layer 50 formed on the first electrode 20, a second electrode 90 formed on the upper part of the light emitting layer 50, and an organic film layer 100 having electric charge carrying capability formed between the first electrode 20 and second electrode 90, wherein the organic film layer 100 is doped with a UV stabilizer, and the UV stabilizer is in the absorption range of 420 nm or less.

In one of the embodiments according to the present invention, the light emitting layer 50 is not doped with a UV stabilizer.

In the present preferred embodiment, one or more compounds selected from the group consisting of hydroxybenzophenone-based compound, hydroxyphenylbenzotriazole-based compound, hindered-amines-based compound, organometallic compound comprising one metal selected from the group consisting of iron, nickel and cobalt, salicylate-based compound, cinnamate derivative, resorcinol-monobenzoates-based compound, oxanilides-based compound, hydroxybenzoates-based compound, organic or inorganic pigment, carbon black, coumarines-based compound, stilbene derivative, benzoxazolyl-based compound, benzimidazolyl-based compound, naphthlyimide-based compound, diaminostilbenesulfonate-based compound, triazinestilbene-based compound, phenylester-based compound, benzotriazole-based compound, S-triazine-based compound, hydroxyphenyl-derivative-of-benzoxazole-based compound, hexamethylphosphoricamide-based compound, benzylidenemalonate-based compound, aliphatic-amine or amino-alcohol-based derivative, nitroaromatic compound, substituted-acrylonitrile-based compound, ferrocene-based compound, nitrophenylazophenol-based compound, azo compound, polyene-based polymer derivative, piperidine-based compound, piperidineoxy-based compound, borontrifluoride-based compound, thiadiazole-based compound, and phosphonate-based compound are used as the UV stabilizer. The UV stabilizer is doped to a concentration of 0.001 to 10% by the same reasons as in the above preferred embodiment.

Furthermore, the organic film layer 100 having electric charge carrying capability comprises one or more layers selected from the group consisting of the hole injection layer 30, hole transport layer 40, hole blocking layer 60, electron transport layer 70, and electron injection layer 80. The one or more layers comprising the organic film layer 100 and selected from the group consisting of the hole injection layer 30, hole transport layer 40, hole blocking layer 60, electron transport layer 70 and electron injection layer 80 are each doped with a UV stabilizer.

Furthermore, an organic electroluminescent display device of the present preferred embodiment can be applied to a rear light emitting structure as well as a front light emitting structure. The first electrode 20 is an anode electrode, and the second electrode 90 is a cathode electrode in case of a front light emitting structure, whereas the first electrode 20 is the cathode electrode, and the second electrode 90 is the anode electrode in case of a rear light emitting structure.

A method for fabricating an organic electroluminescent display device according to the preferred embodiments of the present invention is described as follows.

First electrode 20 for defining pixel region is formed on a substrate 10. Hole injection layer 30 and/or hole transport layer 40 are formed on the anode in succession in the case where the first electrode 20 is an anode.

The hole injection layer 30 and/or hole transport layer 40 are doped with a UV stabilizer, wherein the UV stabilizer is in the absorption range of 420 nm or less so that the UV stabilizer does not absorb light coming from an organic electroluminescent display device.

In the case of a polymer organic electroluminescent display device, the hole injection layer 30 and/or hole transport layer 40 doped with the UV stabilizer on the anode is formed through the following process.

A cathode contact part is wiped out by coating a blended material on the anode to a thickness of hundreds of angstrom (Å) and heat treating the blended material coated anode after blending a material forming the hole injection layer 30 with an electron acceptor material. Consequently, the cathode contact part is wiped out by coating a blended material on the hole injection layer 30 to a thickness of hundreds of angstrom (Å) and heat treating the blended material coated hole injection layer after blending a material forming the hole transport layer 40 with dopant.

Otherwise, the dopant may not be blended with any one material out of a material used as the hole injection layer 30 and a material used as the hole transport layer 40 on the anode. It is preferable to blend the dopant only with the material used as the hole injection layer 30.

In the case of a small molecular organic electroluminescent display device, the hole injection layer 30 and/or hole transport layer 40 doped with the UV stabilizer on the anode is formed through the following process.

A hole injection layer 30 is formed on the anode to a thickness of hundreds of angstrom (Å) by co-depositing the hole injection layer 30 with a UV stabilizer after loading into a deposition chamber a substrate 10 on which a first electrode 20 that is an anode is formed. A hole transport layer 40 is formed on the hole injection layer 30 to a thickness of hundreds of angstrom (Å) by co-depositing the hole transport layer 40 with the UV stabilizer. Otherwise, the hole injection layer 30 or hole transport layer 40 is purely deposited without co-deposition with the UV stabilizer.

Red, green and blue materials are respectively deposited on a substrate on which the UV stabilizer doped hole injection layer 30 and/or hole transport layer 40 are formed using fine metal mask (FMM), or the red, green and blue materials are patterned on the substrate using laser induced thermal imaging (LITI). One or more layers of hole blocking layer 60, electron transport layer 70 and electron injection layer 80 are formed on the light emitting layer 50 after finishing the patterning. Consequently, sealing the cathode electrode 90 after forming a cathode electrode 90 completes fabrication of an organic electroluminescent display device.

The present invention discloses the following test examples, which are presented only to help understand the present invention. The present invention is not restricted to the following test examples.

TEXT EXAMPLE 1

An organic electroluminescent display device in which a UV stabilizer was doped on the hole blocking layer 60 was fabricated to be a rear light emitting type organic electroluminescent display device.

A pixel region was defined by patterning indium tin oxide (ITO) as the anode on a substrate. The substrate was treated by UV-O$_3$ for 15 minutes after cleaning the ITO-formed substrate. A solution with 2 wt. % of a UV stabilizer was spin-coated to a thickness of 25 nm on 9,9'-dioctylfluorene-co-N-(4-butylphenyl)-diphenylamine (Dow Chemical Company, TFB), i.e., the hole injection layer on the cleaned substrate. Subsequently, the hole injection layer was dried to a temperature of 220° C. for 10 minutes after peeling off the hole injection layer of the cathode contact part.

The hole transport layer, light emitting layer, hole blocking layer, electron transport layer, electron injection layer and cathode electrode were sequentially deposited in the deposition machine by moving to a deposition machine a substrate on which the hole injection layer was deposited, and the respective layers deposited on the substrate were sealed using a dehumidifier and organic cover.

N,N'-di(naphthalen-1-yl)-N,N'-diphenyl-benzidine (NPB) was deposited to a thickness of 25 nm as the hole transport layer, IDE 120 containing 6 wt. % of DPVBi type dopant (Idemitsu Kosan) as a small molecular blue-light-emitting material was deposited to a thickness of 20 nm as the light emitting layer, BAlq was deposited to a thickness of 5 nm as the hole blocking layer, Alq3 was deposited to a thickness of 20 nm as the electron transport layer, LiF was deposited to a thickness of 0.5 nm as the electron injection layer, and aluminum (Al) was deposited to a thickness of 300 nm as the cathode.

That is, a combination of anode (ITO)/hole injection layer (9,9'-dioctylfluorene-co-N-(4-butylphenyl)-diphenylamine (Dow Chemical Company, TFB)), 25 nm)/hole transport layer (N,N'-di(naphthalen-1-yl)-N,N'-diphenyl-benzidine (NPB), 25 nm)/light emitting layer (IDE 120+6 wt. % of DPVBi type dopant (Idemitsu Kosan), 20 nm)/hole blocking layer (BAlq, 5 nm)/electron transport layer (Alq3, 20 nm)/electron injection layer (LiF, 0.5 nm)/cathode (Al, 300 nm) were used.

COMPARATIVE EXAMPLE 1

Figure 2:
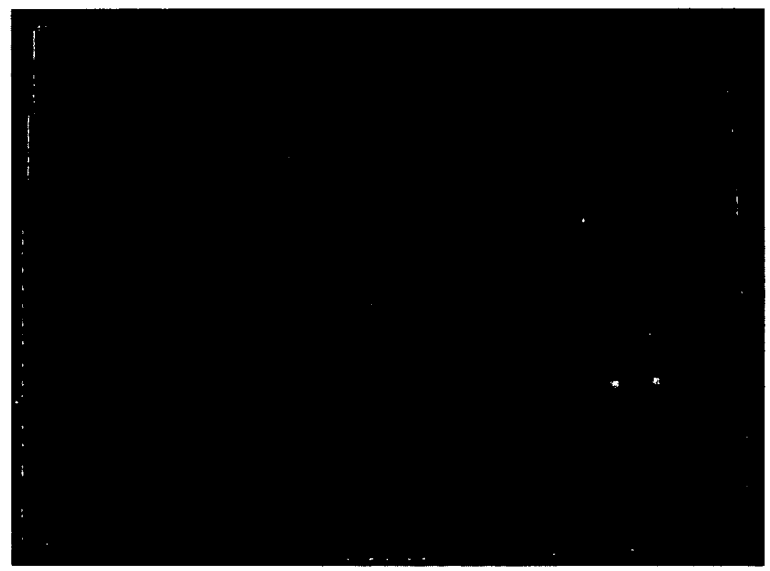
FIG. 2 is a photograph showing the change in an organic electroluminescent display device after exposing an organic electroluminescent display device fabricated by Comparative Example 1 (further discussed herein) to sunlight.

A pixel region was defined by patterning ITO on the substrate using the anode to observe directly the problems generated when a UV stabilizer was not doped on the substrate. The substrate was treated by UV-O$_3$ for 15 minutes after cleaning the ITO-formed substrate. An organic EL device was formed by a standard recipe (deposition process) in a state in which all layers were not doped with a UV stabilizer. FIG. 2 illustrates a photograph taken picture of the EL substrate driven again after writing down the numbers "83 to 18" on an EL substrate with a black name pen to block light and then leaving the number-written EL substrate alone for approximately 24 hours. It can be seen in FIG. 2 that the part on which the numbers are written down is brighter. Thus, it can be seen that luminance reduction is substantially reduced if the light blocking function is decreased during fabrication of an actual substrate.

The organic electroluminescent display device has the structure of an anode (ITO)/hole injection layer (9,9'-dioctylfluorene-co-N-(4-butylphenyl)-diphenylamine (Dow Chemical Company, TFB), 30 nm)/hole transport layer (N,N'-di(naphthalen-1-yl)-N,N'-diphenyl-benzidine (NPB), 30 nm)/light emitting layer (IDE 120+6 wt. % of DPVBi type dopant (Idemitsu Kosan), 20 nm)/hole blocking layer (BAlq, 5 nm)/electron transport layer (Alq3, 20 nm)/electron injection layer (LiF, 0.5 nm)/cathode (Al, 300 nm).

Figure 3:
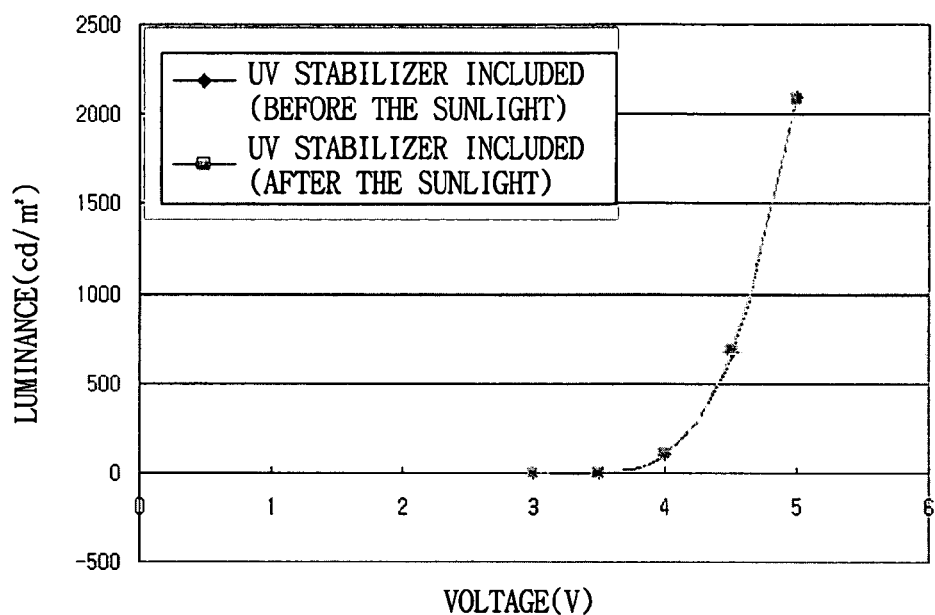
FIG. 3 is a graph showing voltage-luminance characteristics before and after exposing an organic electroluminescent display device fabricated by Test Example 1 (further discussed herein) to sunlight.
Figure 4:
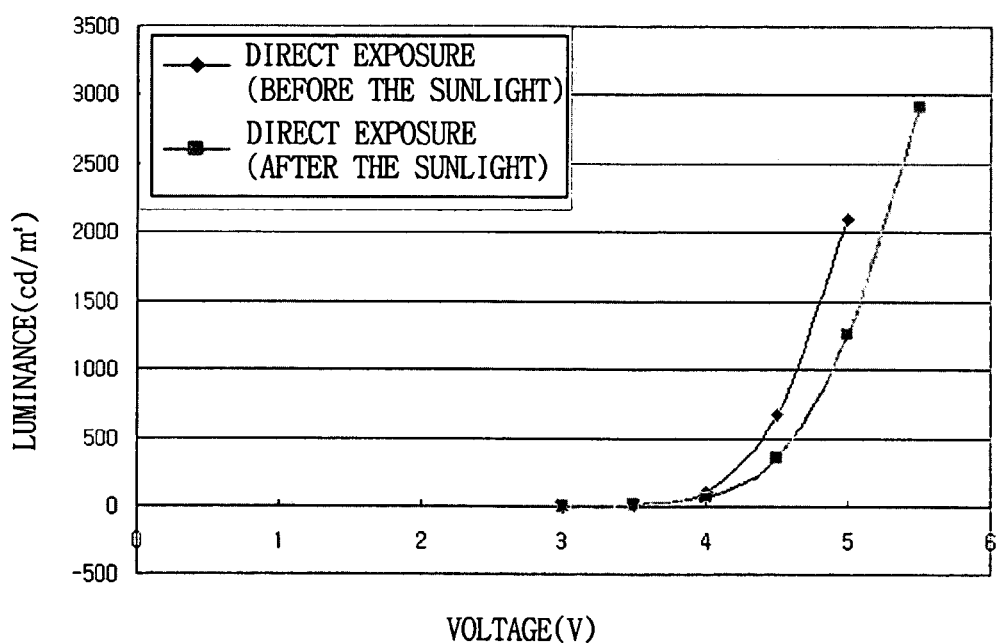
FIG. 4 is a graph showing voltage-luminance characteristics before and after exposing an organic electroluminescent display device fabricated by Comparative Example 1 to sunlight.

FIG. 3 and FIG. 4 are graphs showing voltage-luminance characteristics before and after exposing organic electroluminescent display devices fabricated by Test Example 1 and Comparative Example 1 to sunlight. FIG. 3 shows that voltage-luminance characteristics before and after exposing an organic electroluminescent display device to the sunlight are not changed at all when the hole injection layer is doped with a UV stabilizer as in Test Example 1. However, FIG. 4 shows that a higher voltage is required for the same luminance in the voltage-luminance graph before and after exposing the organic electroluminescent display device to sunlight when the hole injection layer is not doped with the UV stabilizer.

An increase in the driving voltage or drop in efficiency by exposure to sunlight did not occur with an organic electroluminescent display device having the same structure except that the UV stabilizer was doped on the hole injection layer by the present invention. Therefore, it can be seen that the decomposition effect of ultraviolet rays is almost eliminated even when an organic electroluminescent display device of the present invention is used in the external sunlight.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An organic electroluminescent display device, comprising:
    a substrate;
    a first electrode formed on the substrate;
    a light emitting layer formed on the first electrode; and
    a second electrode formed on an upper part of the light emitting layer,
    wherein the light emitting layer is doped with a UV stabilizer, and the UV stabilizer has an absorption range of 420 nm or less, and
    wherein the UV stabilizer is one or more compounds selected from the group consisting of hydroxybenzophenone-based compound, hydroxyphenylbenzotriazole-based compound, hindered-amines-based compound, organometallic compound comprising one metal selected from the group consisting of iron, nickel and cobalt, salicylate-based compound, cinnamate derivative, resorcinol-monobenzoates-based compound, oxanilides-based compound, hydroxybenzoates-based compound, carbon black, stilbene derivative, benzoxazolyl-based compound, benzimidazolyl-based compound, naphthlyimide-based compound, diaminostilbenesulfonate-based compound, triazinestilbene-based compound, phenylester-based compound, benzotriazole-based compound, S-triazine-based compound, hydroxyphenyl-derivative-of-benzoxazole-based compound, hexamethylphosphoricamide-based compound, benzylidenemalonate-based compound, aliphatic-amine-or amino-alcohol-based derivative, nitroaromatic compound, substituted-acrylonitrile-based-compound, ferrocene-based compound, nitrophenylazophenol-based compound, azo compound, polyene-based polymer derivative, piperidine-based compound, piperidineoxy-based compound, borontrifluoride-based compound, thiadiazole-based compound, and phosphonate-based compound.

2. The organic electroluminescent display device according to claim 1, wherein the UV stabilizer is doped to a concentration of 0.001 to 10%.

3. The organic electroluminescent display device according to claim 1, wherein the first electrode is an anode electrode, and the second electrode is a cathode electrode.

4. The organic electroluminescent display device according to claim 1, wherein the first electrode is a cathode electrode, and the second electrode is an anode electrode.

5. The organic electroluminescent display device according to claim 1, wherein the organic electroluminescent display device further comprises an organic film layer having electric charge carrying capability positioned between the first electrode and the second electrode.

6. The organic electroluminescent display device according to claim 5, wherein the organic film layer having electric charge carrying capability comprises one or more layers selected from the group consisting of hole injection layer, hole transport layer, hole blocking layer, electron transport layer and electron injection layer.

7. The organic electroluminescent display device according to claim 6, wherein the first electrode is an anode electrode, and the second electrode is a cathode electrode.

8. The organic electroluminescent display device according to claim 6, wherein the first electrode is a cathode electrode, and the second electrode is an anode electrode.

9. The organic electroluminescent display device according to claim 6, wherein one or more layers selected from the hole injection layer, hole transport layer, hole blocking layer, electron transport layer and electron injection layer are doped with a UV stabilizer.

10. The organic electroluminescent display device according to claim 9, wherein the UV stabilizer is doped to a concentration of 0.001 to 10%.

11. The organic electroluminescent display device according to claim 9, wherein the first electrode is an anode electrode, and the second electrode is a cathode electrode.

12. The organic electroluminescent display device according to claim 9, wherein the first electrode is a cathode electrode, and the second electrode is an anode electrode.

13. An organic electroluminescent display device comprising:
    a substrate;
    a first electrode formed on the substrate;
    a light emitting layer formed on the first electrode;
    a second electrode formed on the upper part of the light emitting layer; and
    an organic film layer having electric charge carrying capability formed between the first electrode and the second electrode,
    wherein the organic film layer having electric charge carrying capability is doped with an UV stabilizer, and the UV stabilizer has an absorption range of 420 nm or less, and
    wherein the UV stabilizer is one or more compounds selected from the group consisting of hydroxybenzophenone-based compound, hydroxyphenylbenzotriazole-based compound, hindered-amines-based compound, organometallic compound comprising one metal selected from the group consisting of iron, nickel and cobalt, salicylate-based compound, cinnamate derivative, resorcinol-monobenzoates-based compound, oxanilides-based compound, hydroxybenzoates-based compound, carbon black, stilbene derivative, benzoxazolyl-based compound, benzimidazolyl-based compound, naphthlyimide-based compound, diaminostilbenesulfonate-based compound, triazinestilbene-based compound, phenylester-base compound, benzotriazole-based compound, S-triazine-based compound, hydroxyphenyl-derivative-of-benzoxazole-based compound, hexamethylphosphoricamide-based compound, benzylidenemalonate-based compound, aliphatic- amine -or amino-alcohol-based derivative, nitroaromatic compound, substituted-acrylonitrile-based compound, ferrocene-based compound, nitrophenylazophenol-based compound, azo compound, polyene-based polymer derivative, piperidine-based compound, piperidineoxy-based compound, borontrifluoride-based compound, thiadiazole-based compound, and phosphonate-based compound.

14. The organic electroluminescent display device according to claim 13, wherein the UV stabilizer is doped to a concentration of 0.001 to 10%.

15. The organic electroluminescent display device according to claim 13, wherein the first electrode is an anode electrode, and the second electrode is a cathode electrode.

16. The organic electroluminescent display device according to claim 13, wherein the first electrode is a cathode electrode, and the second electrode is an anode electrode.

17. The organic electroluminescent display device according to claim 13, wherein the UV stabilizer is doped on the organic film positioned on a light emitting direction.

* * * * *